United States Patent [19]

Ogura et al.

[11] Patent Number: 4,528,216
[45] Date of Patent: Jul. 9, 1985

[54] PROCESS FOR FORMING HEAT-RESISTANT RESIN FILMS OF POLYIMIDE AND ORGANOSILICIC REACTANTS

[75] Inventors: Ken Ogura; Hiroshi Nakaboh, both of Tokyo, Japan

[73] Assignee: Oki Electric Industry Co., Ltd., Tokyo, Japan

[21] Appl. No.: 581,365

[22] Filed: Feb. 17, 1984

[30] Foreign Application Priority Data

Feb. 24, 1983 [JP] Japan .................................. 58-28586
Sep. 19, 1983 [JP] Japan ................................ 58-171193
Sep. 22, 1983 [JP] Japan ................................ 58-174105
Sep. 22, 1983 [JP] Japan ................................ 58-174106

[51] Int. Cl.³ .......................................... B05D 3/02
[52] U.S. Cl. ...................................... 427/387; 427/96; 427/385.5; 428/473.5
[58] Field of Search .............. 427/385.5, 387, 96, 427/93, 82; 524/261, 845; 428/473.5

[56] References Cited

U.S. PATENT DOCUMENTS 3,682,698  8/1972  Palmer et al. .................... 427/385.5
4,101,487  7/1978  Peterson .......................... 427/385.5
4,467,000  8/1984  Economy et al. ................. 427/385.5

FOREIGN PATENT DOCUMENTS 51-44871  12/1976  Japan .
52-16488   5/1977  Japan .
52-20825   6/1977  Japan .

OTHER PUBLICATIONS

*Thin Solid Films*, 83(1981), pp. 145–163, "Polyimide Insulators for Multilevel Interconnections".

*Primary Examiner*—Sadie L. Childs
*Attorney, Agent, or Firm*—Wenderoth, Lind & Ponack

[57] ABSTRACT

A process for forming heat resistant resin films comprising the steps of admixing a polyimide resin precursor solution, for example, a solution containing a reactant obtained from pyrromellitic dianhydride, 3,3',4,4'-benzophenyltetracarboxylic acid dianhydride, 4,4'-diaminodiphenyl ether, and 4,4'-diaminodiphenyl ether-3-carbonic amide with an organosilicic compound solution, coating a silicon substrate with the resulting admixture, and subjecting said coated silicon substrate to heat treatment.

7 Claims, 6 Drawing Figures

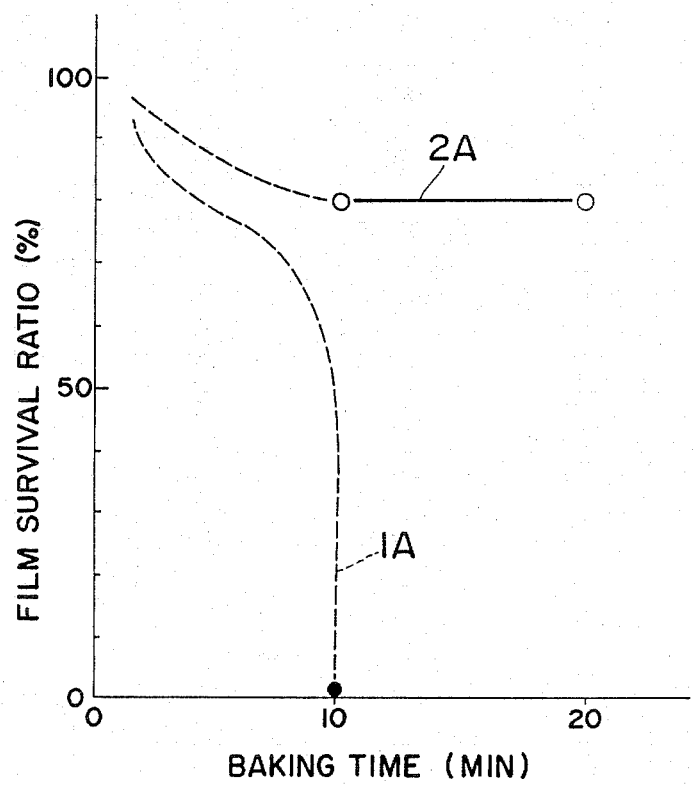

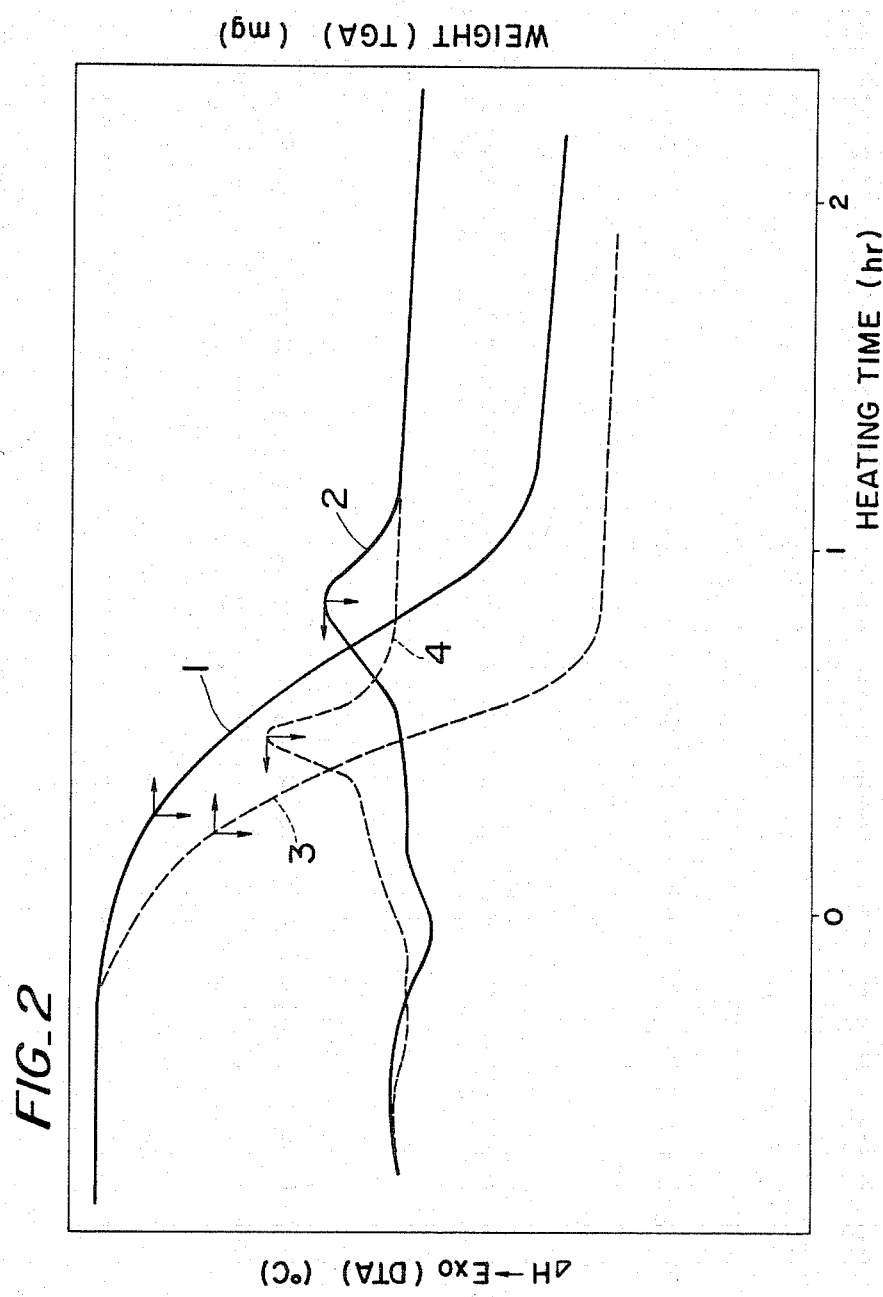
FIG_2

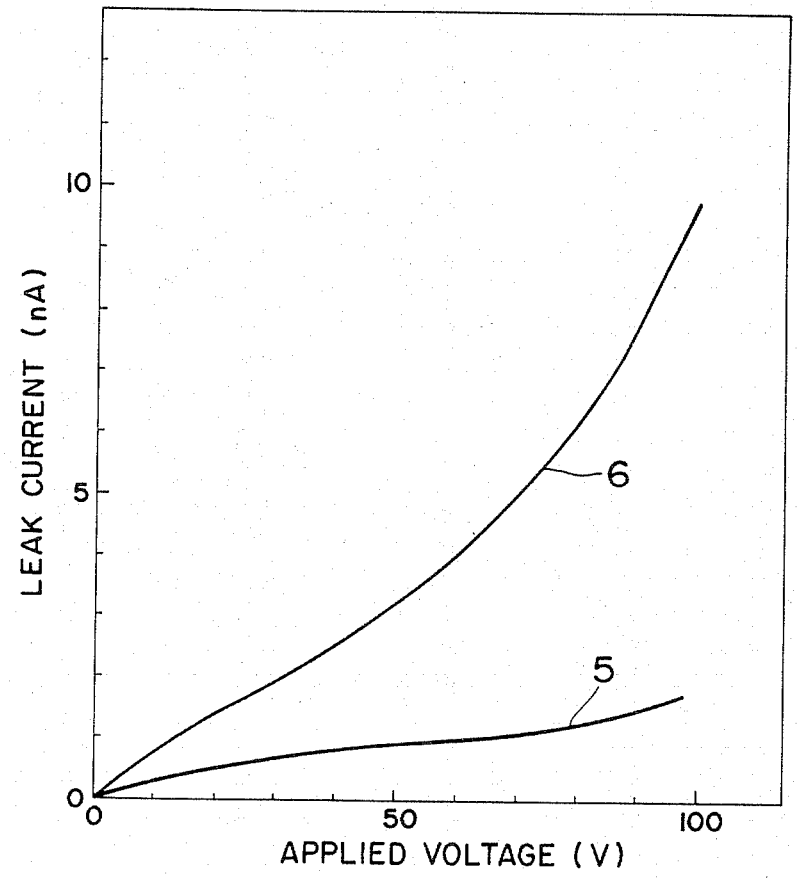
FIG_3

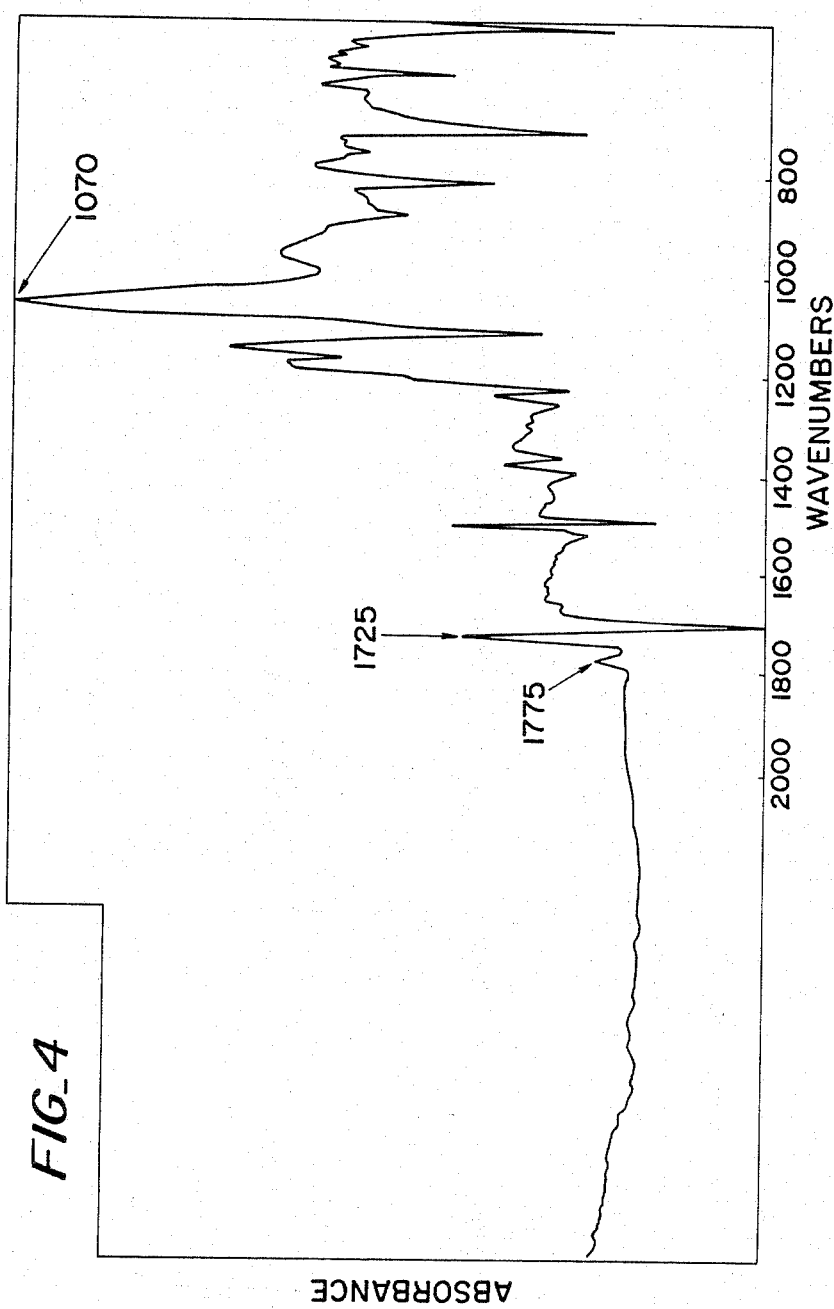
FIG_4

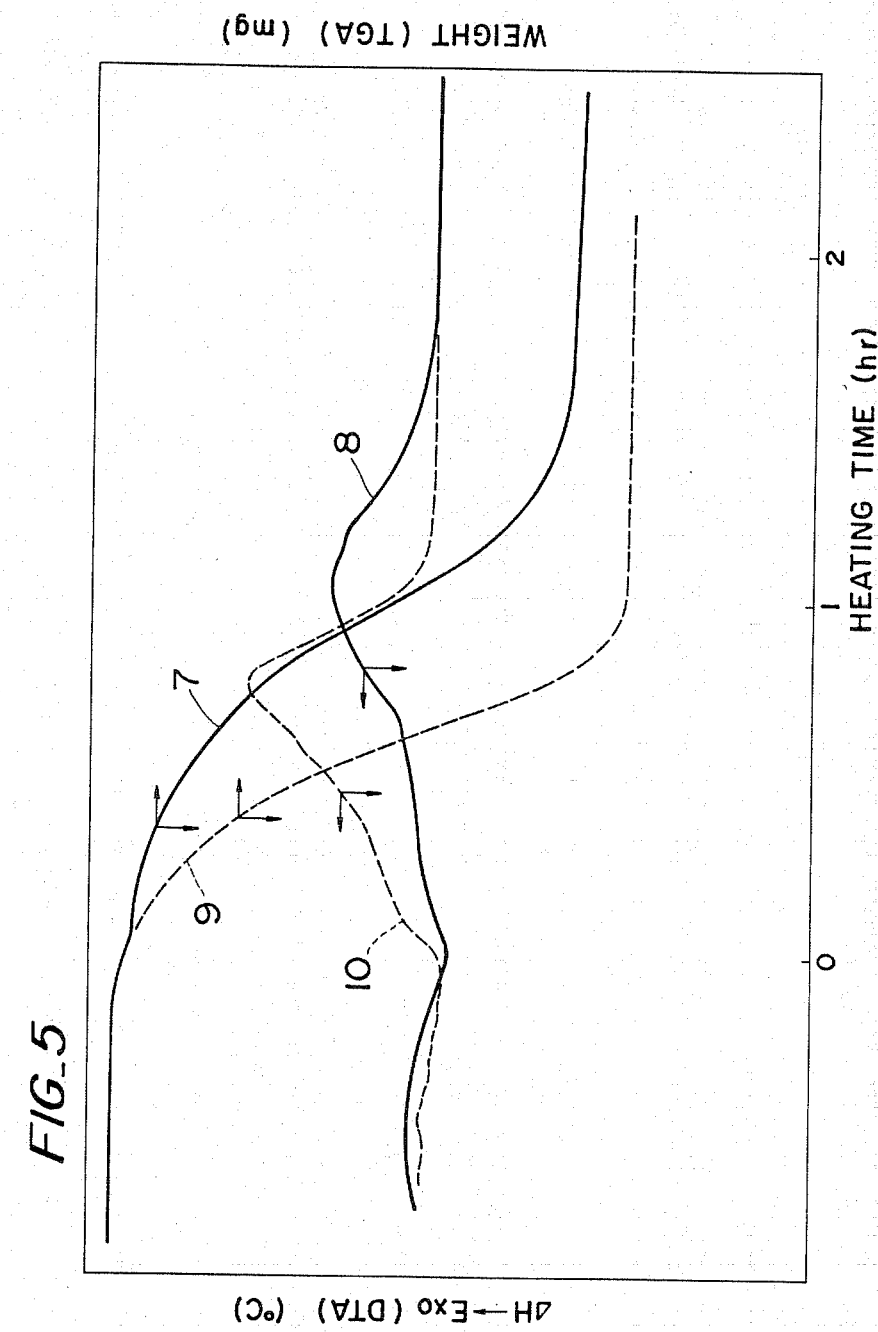
FIG_5

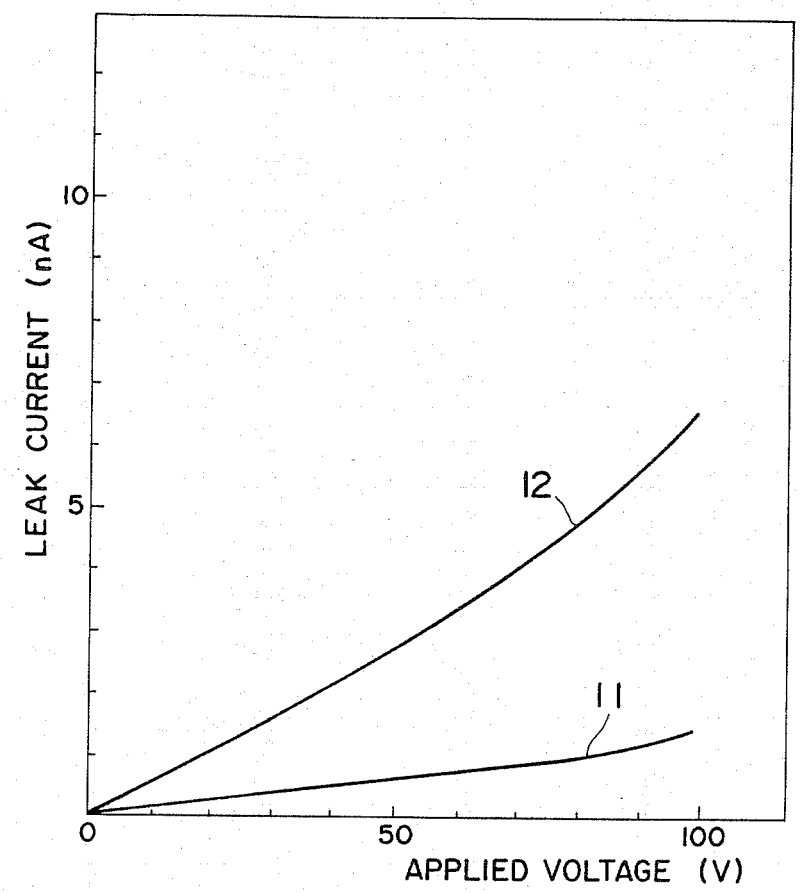
FIG_6

PROCESS FOR FORMING HEAT-RESISTANT RESIN FILMS OF POLYIMIDE AND ORGANOSILICIC REACTANTS

BACKGROUND OF THE INVENTION

1. Field of the Invention

This invention relates to a process for forming a heat resistant resin film used in semiconductor integrated circuit devices, and more particularly to a process for forming a heat resistant resin film which can be used as an intermediate insulating layer.

2. Description of the Prior Art

These days, a multi-layer interconnection technique is essential to increase the packing density of an integrated circuit device. In the multi-layer technique, multi-leveled conductive layers are electrically insulated from one another by insulating layers. The insulating layer is necessarily subjected to a relatively high temperature of about 500° C. for at least 10–20 minutes during a heating process. Therefore, it is required that the insulating layer material has its superior heat-resistant property and is chemically stable during a heating process. Well-known polyimide resins and chemically-produced silicon dioxide have been used as such insulating materials. For example, a polyimide resin is described in detail in Japanese Patent Publication No. 44871/1976.

In order to form a polyimide resin film, a polyamic acid solution is coated on the surface of a silicon substrate. The polyamic acid is a polyimide resin precursor and has the following molecular structure.

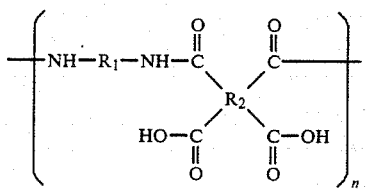

When the polyamic acid is heated at a temperature of approximately 200° C. to vaporize the solvent therein, it turns through dehydration into a polyimide resin film having the following ring closure structure.

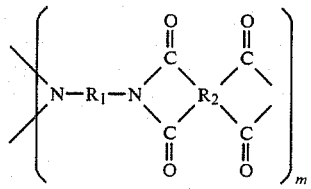

However, such polyimide resin film gradually decreases in weight and thickness when heated in an oxygen atmosphere at a temperature of 420°–470° C. At 530° C., this resin film decomposes by being baked within about 10 minutes as shown as the line 1A in FIG. 1. Therefore, the polyimide resin film shows poor heat resistant properties.

In addition, the polyimide resin has a relatively large ion mobility, so that it is not proper as a passivation material for suppressing the leak current in a silicon substrate.

On the other hand, a chemically produced silicon dioxide is described in detail in Japanese Patent Publication Nos. 20825/1977 and 16488/1977. An organosilicic compound, for example, is obtained by dissolving a silicon acetate as a principal constituent into ethyl alcohol. When the silicon acetate solution obtained is coated on the surface of a silicon substrate, and heated at a temperature of approximately 400° C. in an oxygen atmosphere, the organosilicic compound turns into a chemical $SiO_2$ film. Such $SiO_2$ film features a high heat resistant temperature of about 1000° C. and can be used as a mask against impurities. However, it is difficult to form a thick film of 1–2 $\mu$m from an organosilicic compound, because it shrinks by heat treatment and cracks.

As described above, both a polyimide resin and a chemically produced $SiO_2$ are not enough as intermediate insulating materials for electrically insulating laminated conductive layers in semiconductive ICs.

BRIEF DESCRIPTION OF THE DRAWINGS

FIGS. 1 and 2 are graphic representations each shwoing heat resisting characteristics of the heat resistant resin film according to the present invention;

FIG. 3 is a graphic representation showing leak current characteristics of the resin film according to the present invention;

FIG. 4 is a graphic representation showing FTIR analytical characteristics of the resin film in another example according to the present invention;

FIG. 5 is a graphic representation showing heat resisting characteristics of the heat resistant resin film in another example according to the present invention; and FIG. 6 is a graphic representation showing leak current characteristics of the heat resistant resin film of FIG. 5.

SUMMARY OF THE INVENTION

Accordingly, it is an object of the present invention to provide a process for forming a resin film having a high heat resistant property.

Another object of the present invention is to provide a process for forming a thick resin film which electrically insulates conductive layers from one another.

Still another object of the present invention is to provide a process for forming a heat resistant resin film which provides a good passivation effect.

Other objects and advantages of the invention will be apparent from the following description and the appended claims.

DETAILED DESCRIPTION OF THE INVENTION

According to the invention, a polyamic acid solution and an organosilicic compound solution are firstly prepared. The polyamic acid solution is obtained by dissolving both a primary diamine and a dicarboxylic anhydride with a solvent. Specific examples of diamines include diaminocarbonic amide, m-phenylenediamine, p-phenylene diamine, 2,2'-bis(4-aminophenyl)propane, 4,4'-methylenedianiline, benzidine, 4,4'-diaminodiphenylsulfide, 4,4'-diaminodiphenylsulfone, 4,4'-diaminodiphenyl ether, hexamethylenediamine, heptamethylenediamine, octamethylenediamine, nonamethylenediamine, decamethylenediamine, 3-methylheptamethylenediamine, 4,4'-dimethylheptamethylenediamine and the like.

Also, examples of the dicarboxylic anhydride include pyromellitic anhydride, 2,3,6,7-naphthalenetetracarboxylic anhydride, 3,3',4,4'-diphenyltetracarboxylic anhydride, 1,2,5,6-naphthalenetetracarboxylic anhydride, 2,2',3,3'-diphenyltetracarboxylic anhydride, thiophene-2,3,4,5-tetracarboxylic anhydride, 2,2'-bis(3,4-biscarboxyphenyl)propane anhydride, 3,4-dicarboxyphenylsulfonic anhydride, perylene-3,4,9,10-tetracarboxylic anhydride, bis(3,4-dicarboxyphenyl)ether anhydride, ethylenetetracarboxylic anhydride, 3,3',4,4'-benzophenonetetracarboxylic anhydride and the like.

Furthermore, specific examples of solvent include N,N-dimethylformamide, N,N-dimethylacetamide, dimethyl sulfoxide, N-methyl-2-pyrrolidone, tetramethylurea, N-methylcaprolactam, pyridine, aromatic hydrocarbons and the like, and any of these solvents may be used either alone or in combination with one another.

Solvents according to the invention are reqired to strongly attach two solutes described above to each other and to maintain them, not so as to set them, at low temperatures.

On the other hand, the organosilicic compound solution is prepared by dissolving a silicon compound having the following formula:

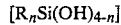

wherein R is a monovalent hydrocarbon group, and n is 0 or an integer of 1-4, and an additive such as a glass forming agent and organic binder into an organic solvent such as an alcohol, an ester and a ketone. The resulting solution may contain 20% by weight or less of silicon compound, based on the total weight of the solution.

Next, both the polyamic acid solution and organosilicic compound solution are mixed together. The resulting mixture is coated on the surface of a silicon substrate, and heated at a temperature of 80°-500° C. to form an insulating resin film of about 1-2 μm in thickness having an Si—O—Si and polyimide molecular structures thereon. The resulting resin film showed remarkably elevated resistant properties and a smooth surface without cracks.

According to this invention, phosphorus may be added to the silicon compound to improve the passivation effect at the surface of a silicon substrate. In this case, phosphorus is added by dissolving the organosilicic compound RnSi(OH)$_{4-n}$ and phosphorus compound

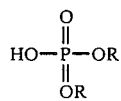

into such organic solvent as described above. The content of phosphorus is preferably within a range of 1-25% by weight based on the total weight of the silicon compound.

EXAMPLE 1

First, a polyamic acid solution was prepared by dissolving a diaminocarbonic amide and a dicarboxylic dianhydride into an N-methyl-2-pyrrolidone solution so as to prepare a solution of about 14.2% by weight of solid content, based on the total weight of the solution. Also, an organosilicic compound solution was prepared by dissolving a silicon acetate and an additive into an organic solvent so the solvent contains about 3% of organosilicic compound component, based on the total weight of the solution.

Next, 22 cc of the polyamic acid solution and 10 cc of the organosilicic compound solution were mixed. The mixed solution was applied on the surface of a silicon substrate by means of a spinner to form a relatively thick layer, then heated at about 80°-500° C. for 1 hour to form a silicon polyimide film of 1-2 μm in thickness thereon.

To investigate the changes in film thickness, the silicon polyimide film was placed in a furnace under a forced-air circulation at a temperature of 530° C. for 10-20 minutes. As a result, the silicon-polyimide resin film according to the invention proved to sufficiently withstand a high temperature of about 530° C. for at least 20 minutes at an about an 80% film survival ratio. (See the solid line 2A in FIG. 1) Also, in a microscopic examination, cracks were not particularly observed on the surface of the silicon-polyimide resin film.

EXAMPLE 2

The silicon-polyimide resin film produced by mixing both 22 cc of the polyamic acid solution and 22 cc of the organosilicic compound solution was subjected to the same resistant tests as that of Example 1. As a result, the resin film according to the invention proved to possess a higher heat resistant property than that of Example 1.

EXAMPLE 3

A heat resistant insulating resin film having good passivation properties was obtained by the following ways. First, polyamic acid solution was prepared by dissolving both diaminocarbonic amide and an acid dianhydride into an N-methyl-2-pyrrolidone solution so that the solution contains about 14.2% by weight of a solid content, based on the total weight of the solution. Also, an organosilicic compound solution was prepared by adding 1 gram of phosphorus into 100 cc of a silicon acetate solution.

Next, 22 cc of the polyamic acid solution and 10 cc of the organosilicic compound solution containing phosphorus were mixed. The mixed solution was applied on the surface of a silicon substrate by means of a spinner to form a relatively thick layer, and then heated at about 80°-500° C. for 1 hour to form a silicon polyimide film of 1-2 μm in thickness thereon. As a result, the silicon polyimide resin obtained proved to have both a Si—O—Si structure containing phosphorus and a polyimide structure.

In the silicon polyimide resin film obtained, a thermogrovinetric analysis (TGA) was performed by measuring the decreasing weight of the resin under an air of 500° C., and a differential thermal analysis (DTA) was performed by measuring the exothermic temperatures generated by the decomposition of the resin under the air at 500° C.

In FIG. 2, curves 1 and 2 respectively show TGA and DTA characteristics for the resin according to the invention. For comparison, the TGA and DTA characteristics for a polyimide resin alone are shown respectively by curves 3 and 4 in FIG. 2. From this fact, it is clear that the resin according to the invention has a higher decomposition temperature than that of the polyimde resin alone.

In addition, the passivation effect of the resin thus obtained was examined. In FIG. 3, the curve 5 shows the leak current characteristics for the resin of the invention, while curve 6 shows such characteristics for the polyimide resin alone. From FIG. 3, it is clear that the resin according to the invention has better passivation effects.

EXAMPLE 4

The silicon polyimide resin film produced by mixing both 22 cc of the polyamic acid solution and 22 cc of the organosilicic compound solution containing phosphorus was subjected to the same heat resistant tests as those of Example 3. As a result, the resin film according to the invention proved to have higher heat resistant properties than those of Example 3.

EXAMPLE 5

The same procedure as that of Example 4 was effected except that phosphorus was added to an organosilicic compound solution within a range of 0.1 g–5 g. As a result, a resin film having characteristics equivalent to those of Example 4 could be formed.

EXAMPLE 6

The same procedure with that of Example 4 was carried out except that silicon hydroxide was used in place of silicon acetate. As a result, it was confirmed that a resin film having such characteristics equivalent to those of the resin films prepared in the above described Examples could be obtained.

EXAMPLE 7

First, a reactant solution (14.2% resin content) obtained by dissolving pyromellitic dianhydride, 3,3',4,4'-benzophenyltetracarboxylic acid dianhydride, 4,4'-diaminodiphenyl ether, and 4,4'-diaminodiphenyl ether-3-carbonic amide into an N-methyl-2-pyrrolidone solution was previously prepared as a polyimide precursor. Also, an organosilicic compound solution was prepared, which, for example, is a silicon acetate containing about 3% of a organosilicic compound component.

Next, 20 cc of the reactant solution and 10 cc of the aforementioned organosilicic compound solution were admixed each other. The resulting admixture was applied on the surface of a silicon substrate by means of a spinner. Then, the silicon substrate was heated at 100° C. for 1 hour. As a result, a silicon polyimide resin film having a thickness of 1–2 μm was formed on the surface of the silicon substrate. The silicon polyimide resin film obtained was subjected to the TGA and DTA under air at 500° C.

In FIG. 5, the curves 7 and 8 show the TGA and DTA characteristics respectively, for the resin according to the invention.

For comparison, the TGA and DTA characteristics on a resin film obtained by using polyimide only are respectively shown by the curves 9 and 10. Judging from the peaks of the curves 8 and 10 showing exothermic reactions, it is clear that the resin according to the invention has a better heat resistance than the resin film produced by using polyimide only. In a microscopic examination, cracks were not particularly observed on the surface of the silicon polyimide resin film. Moreover, a FTIR (Fourier Transform Infrared) absorption spectrum analysis was carried out to the silicon-polyimide resin film cured at 350° C. for 1 hour. In FIG. 4, the absorption due to a Si—O—Si structure appears at a wave number of 1070 and the absorption characteristics due to an polyimide bond structure appears at wave numbers of 1725 and 1775. These results exhibit that the resin of the invention can be obtained by uniformly compounding a Si—O—Si component with a polyimide component without damaging their individual good properties.

EXAMPLE 8

The same procedure as that of Example 8 was carried out except that an admixture consisting of 20 cc of the polyimide precursor solution of Example 7 and 20 cc of an organosilicic compound solution was used. Then, the resulting resin film was examined in respect of the aforementioned heat resistance, and as a result the present resin film exhibited a higher heat resistance than that of the resin film of Example 7.

EXAMPLE 9

The same procedure with that of Example 7 was effected except that silicon hydroxide was used in place of silicon acetate. As a result, it was confirmed that a resin film having such characteristics equivalent to those of the resin films prepared in the above described Examples could be obtained.

EXAMPLE 10

First, a reactant solution (14.2% resin content) obtained by dissolving pyromellitic dianhydride, 3,3',4,4'-benzophenyltetracarboxylic acid dianhydride, 4,4'-diaminodiphenyl ether, and 4,4'-diaminodiphenyl ether-3-carbonic amide into N-methyl-2-pyrrolidone solution was previously prepared as a polyimide precursor. Also, an organosilicic compound solution was prepared by adding about 1 gram of phosphorus into 100 cc of a silicon acetate solution having 3% organosilicic compound component.

Next, 20 cc of the reactant solution and 10 cc of the aforementioned organosilicic compound solution were admixed with each other. The admixture obtained was applied on the surface of a silicon structure by means of a spinner. Then, the silicon substrate was heated at 80°–500° C. for 1 hour. As a result, a silicon polyimide resin having a thickness of 1–2 μm was formed on the surface of the silicon substrate. To examine heat resistant characteristics, the silicon polyimide resin film was subjected to the TGA and DTA under the air at 500° C.

In a microscopic examination, cracks were not particularly observed on the surface of a silicon polyimide resin film. In addition, the passivation effect was examined in the resin obtained. In FIG. 6, the curve 11 is a leak current characteristic for the resin of the invention, while the curve 12 is for that of the polyimide resin only.

Judging from the two curves, it is clear that the resin of the invention has an improved passivation effect.

EXAMPLE 11

The same procedure as that of Example 11 was carried out except that an admixture of 22 cc of the polyimide precursor solution of Example 11 and 22 cc of an organic silicone compound solution (a phosphorus content being 1g/100 cc organic silicone solution) was utilized. Then, the resulting resin film was examined in respect of the aforementioned heat resistance and leakage current, and as a result more favorable values than those of Example 11 could be obtained.

EXAMPLE 12

The same procedure with that of Example 11 was effected except that phosphorus was added to the aforesaid organic silicone compound solution within a range of 0.1 g–5 g. As a result, a resin film having characteristics equivalent to those of the resin film of Example 11 could be formed.

EXAMPLE 13

The same procedure as that of Example 11 was carried out except that silicon hydroxide was used in place of silicon acetate. As a result, it was confirmed that a resin film having such characteristics equivalent to those of the resin films prepared in the above described Examples could be obtained.

What is claimed is:

1. A process for forming heat resistant resin films comprising the steps of admixing a polyimide resin precursor solution with an organosilicic compound solution, coating a silicon substrate with the resulting admixture, and subjecting said silicon substrate coated to heat treatment.

2. A process for forming heat resistant resin films as claimed in claim 1 wherein said polyimide resin precursor is polyamic acid solution or a solution containing a reactant obtained from diaminocarbonic amide and dicarboxylic anhydride.

3. A process for forming heat resistant resin films as claimed in claim 1 wherein said polyimide resin precursor is a solution containing a reactant obtained from pyromellitic dianhydride, 3,3',4,4'-benzophenyltetracarboxylic acid dianhydride, 4,4'-diaminodiphenyl either, and 4,4'-diaminodiphenyl ether-3-carbonic amide.

4. A process for forming heat resistant resin films as claimed in claim 1 wherein said organosilicic compound solution contains a solution prepared by dissolving either silicon acetate or silicon hydroxide into ethyl alcohol as the principal constituent.

5. A process for forming heat resistant resin films as claimed in claim 1 wherein phosphorus is added to said organosilicic compound solution.

6. A process for forming heat resistant resin films as claimed in claim 1 wherein said admixture of the polyimide resin precursor solution and the organosilicic compound solution is applied on a silicon substrate, and said silicon substrate is heated to convert the polyimide precursor into a polyimide resin, while the organosilicic compound is converted into an Si—O—Si structure, whereby the heat resistant film contains the polyimide resin component and the Si—O—Si structure component uniformly distributed throughout.

7. A process for forming heat resistant resin films as claimed in claim 1 wherein said organosilicic compound solution is prepared by dissolving silicon hydroxide into ethyl alcohol as the principal constituent.

* * * * *